(12) United States Patent
Sumi et al.

(10) Patent No.: US 9,645,189 B2
(45) Date of Patent: May 9, 2017

(54) PARTIAL DISCHARGE CHARGE AMOUNT MEASURING METHOD AND DEVICE

(71) Applicant: Hitachi Metals, Ltd., Tokyo (JP)

(72) Inventors: Yosuke Sumi, Hitachi (JP); Naofumi Chiwata, Mito (JP); Hideyuki Kikuchi, Hitachi (JP)

(73) Assignee: Hitachi Metals, Ltd., Tokyo (JP)

( * ) Notice: Subject to any disclaimer, the term of this patent is extended or adjusted under 35 U.S.C. 154(b) by 609 days.

(21) Appl. No.: 14/088,209

(22) Filed: Nov. 22, 2013

(65) Prior Publication Data

US 2014/0159755 A1    Jun. 12, 2014

(30) Foreign Application Priority Data

Dec. 12, 2012 (JP) .................................. 2012-270994

(51) Int. Cl.
*G01R 31/12* (2006.01)
*G01R 31/14* (2006.01)

(52) U.S. Cl.
CPC ............. *G01R 31/14* (2013.01); *G01R 31/12* (2013.01); *G01R 31/1227* (2013.01); *G01R 31/1263* (2013.01); *G01R 31/1272* (2013.01)

(58) Field of Classification Search
CPC  G01R 31/12; G01R 31/1227; G01R 31/1263; G01R 31/1272; G01R 31/14
See application file for complete search history.

(56) References Cited

U.S. PATENT DOCUMENTS 4,620,145 A  * 10/1986  Dietz ..................... G01N 27/92
                                                              324/456
5,555,148 A     9/1996  Matsuzaki et al.
(Continued)

FOREIGN PATENT DOCUMENTS

JP         58-193471 A      11/1983
JP         04074974 A  *    3/1992
(Continued)

OTHER PUBLICATIONS

Japanese Office Action dated Jan. 6, 2015 with and English translation thereof.
(Continued)

*Primary Examiner* — Kristal Feggins
*Assistant Examiner* — Kendrick Liu
(74) *Attorney, Agent, or Firm* — McGinn IP Law Group, PLLC

(57) ABSTRACT

A partial discharge charge amount measuring method includes generating a partial discharge in a sample by applying a voltage from a voltage impressing device connected to the sample, the voltage being higher than a partial discharge inception voltage, continuously measuring and recording terminal voltages of a capacitor connected in series between the sample and a ground at least until a breakdown of the sample occurs by alternately operating at least two data loggers connected to the capacitor at intervals of a predetermined time, calculating an amount of electric charge discharged from the sample and remaining in the capacitor by multiplying a difference in the recorded terminal voltages of the capacitor by a capacitance of the capacitor, and calculating an accumulated discharge amount by accumulating the discharged amount of electric charge at earliest until the breakdown of the sample occurs.

8 Claims, 6 Drawing Sheets

(56) References Cited

U.S. PATENT DOCUMENTS

| | | | |
|---|---|---|---|
| 6,377,902 B1 * | 4/2002 | Eckert | G01R 1/02 702/127 |
| 2008/0084163 A1 | 4/2008 | Hataoka et al. | |
| 2008/0084164 A1 | 4/2008 | Hirohashi et al. | |
| 2013/0234726 A1 * | 9/2013 | Hobelsberger | G01R 15/16 324/551 |

FOREIGN PATENT DOCUMENTS

| | | |
|---|---|---|
| JP | 07-182052 A | 7/1995 |
| JP | 09-318397 A | 12/1997 |
| JP | 2008-270227 A | 11/2008 |
| WO | WO 2007/141963 A1 | 12/2007 |

OTHER PUBLICATIONS

Japanese Office Action dated Aug. 11, 2015 with an English translation.

Partial Translation of "An Investigation Report on a Cable Using a High-Voltage Inverter", Jan. 27, 2005, EMC Technology Working Group for High-Pressure Cable, Japan Electrical Manufacturers' Association (JEMA), [searched on Jul. 30, 2015, Body, the website <URL: https://www.jema-net.or.jp/Japanese/pis/pdf/PDS_report.pdf>.

\* cited by examiner

PARTIAL DISCHARGE CHARGE AMOUNT MEASURING METHOD AND DEVICE

The present application is based on Japanese patent application No. 2012-270994 filed on Dec. 12, 2012, the entire contents of which are incorporated herein by reference.

BACKGROUND OF THE INVENTION

1. Field of the Invention

The invention relates to a partial discharge charge amount (or electric charge amount in partial discharge) measuring method and a partial discharge charge amount measuring device for indexing the lifetime assessment of, e.g. electric wires such as enameled wire.

2. Description of the Related Art

For example, an electric wire such as enameled wire is formed by providing an insulation (insulating film) so as to surround a conductor. In such an electric wire, partial discharge may occur. The partial discharge occurs due to microvoids within the insulation of the electric wire or between the conductor and the insulation, where an electric field concentrates and very weak discharge occurs thereby. The partial discharge causes a deterioration of the insulation, which may result in an insulation breakdown.

Recently, some motors are driven at variable speed using an inverter power source from the viewpoint of energy saving and improvement in efficiency. A voltage applied from the inverter power source to the motor is a pulse voltage (hereinafter, referred to also as "inverter pulse voltage"). Therefore, when the motor is driven using the inverter power source, the motor is subjected to a high-voltage pulse with a short rise time (hereinafter, referred to also as "inverter surge voltage"). This means that a large electric current is fed through an electric wire (i.e. conductor) used in the motor and surge overvoltage (or inverter surge voltage) is thus applied to the electric wire. Due to the inverter surge voltage applied, a high electrical stress is applied to the electric wire. This causes an increase in electric field intensity in the voids, whereby a partial discharge may be caused in the electric wire. As a result, the insulation breakdown may occur in the electric wire.

Thus, the lifetime of electric wire is sometimes assessed so as to estimate a time to the breakdown of electric wire (i.e., a lifetime of electric wire). The lifetime of electric wire depends on the level of voltage to be applied (impressed) and the time of impressing voltage to the electric wire. Accordingly, the conventional lifetime assessment of electric wire is often carried out by using a V-t test. That is, for example, a predetermined level of inverter voltage pulse and a predetermined frequency are applied to a sample of an electric wire etc. and a time to the breakdown is measured to assess the lifetime of the electric wire (see, e.g. JP-A-2008-270227).

SUMMARY OF THE INVENTION

Under the inverter surge voltage application, a voltage (i.e. a partial discharge inception voltage) at which partial discharge begins in the electric wire may be affected by the rise time of the inverter pulse voltage. The rise time of the inverter pulse voltage is shorter than that of sinusoidal voltage. Therefore, the lifetime of electric wire cannot be accurately assessed by the V-t test in some cases.

It is an object of the invention to provide a partial discharge charge amount measuring method and a partial discharge charge amount measuring device that allow the lifetime of an electric wire to be assessed more accurately.

(1) According to one embodiment of the invention, a partial discharge charge amount measuring method comprises:

generating a partial discharge in a sample by applying a voltage from a voltage impressing device connected to the sample, the voltage being higher than a partial discharge inception voltage;

continuously measuring and recording terminal voltages of a capacitor connected in series between the sample and a ground at least until a breakdown of the sample occurs by alternately operating at least two data loggers connected to the capacitor at intervals of a predetermined time;

calculating an amount of electric charge discharged from the sample and remaining in the capacitor by multiplying a difference in the recorded terminal voltages of the capacitor by a capacitance of the capacitor; and calculating an accumulated discharge amount by accumulating the discharged amount of electric charge at earliest until the breakdown of the sample occurs.

In the above embodiment (1) of the invention, the following modifications and changes can be made.

(i) In the recording of terminal voltages, operation between the at least two data loggers is switched by a timer mechanism connected to the data loggers.

(ii) In the recording of terminal voltages, operation between the at least two data loggers is switched such that one of the data loggers starts operation and another of the data loggers subsequently terminates operation.

(iii) In the calculating of discharged amount of electric charge, the discharged amount is calculated per predetermined period that is from the beginning to the end of operation of one of the data loggers.

(iv) In the calculating of discharged amount of electric charge, discharge voltage in an overlap period of operating the at least two data logger in an overlapping manner is subtracted from voltage measured by either data logger to calculate the discharge amount during the predetermined period.

(v) At least the recording of voltage and the calculating the discharge amount are simultaneously carried out.

(vi) In the recording of terminal voltages, a short circuit connected to both ends of the capacitor causes electric discharge by short-circuiting the both ends of the capacitor when excess electric charge is accumulated in the capacitor.

(vii) The method further comprises, on a display portion, displaying at least the discharge amount until breakdown of the sample occurs.

(2) According to another embodiment of the invention, a partial discharge charge amount measuring device comprises:

a voltage impressing device connected to a sample to apply a predetermined voltage to the sample;

a capacitor connected in series between the sample and a ground;

at least two data loggers for measuring and recording terminal voltage of the capacitor; and a control unit alternately operating the least two data loggers at every predetermined time at least until breakdown of the sample occurs, thereby controlling at least the data loggers to continuously detect the terminal voltage of the capacitor.

In the above embodiment (2) of the invention, the following modifications and changes can be made.

(viii) A capacitance of the capacitor is greater than that of the sample.

(ix) A timer mechanism is connected to the data loggers.

(x) A short circuit is connected to both ends of the capacitor to cause electric discharge by short-circuiting the both ends of the capacitor when excess electric charge is accumulated in the capacitor.

Effects of the Invention

According to one embodiment of the invention, a partial discharge charge amount measuring method and a partial discharge charge amount measuring device can be provided that allow the lifetime of an electric wire to be assessed more accurately.

BRIEF DESCRIPTION OF THE DRAWINGS

The present invention will be explained in more detail in conjunction with appended drawings, wherein.

DETAILED DESCRIPTION OF THE PREFERRED EMBODIMENT

First of all, the knowledge the inventors gained will be described before explaining the embodiment of the invention.

One of measures to more accurately assess the lifetime of electric wire is to calculate an electric charge amount (accumulated electric charge amount) of the electric wire (insulating film) until breakdown of the electric wire occurs. For this, the electric charge amount is calculated based on a discharge current waveform obtained by the V-t test. However, in order to calculate the electric charge amount based on the discharge current waveform obtained by the V-t test (e.g., raw waveform data obtained by an oscilloscope), discharge current waveforms with a steep rise need to be integrated at a sample rate on the order of nanoseconds (ns). Thus, a huge amount of data is required in order to calculate the electric charge amount. Especially when time to breakdown of the electric wire is long, the amount of data required to calculate the electric charge amount further increases correspondingly. As a result, it requires more time to process data and it is sometimes necessary to provide a storage area for storing such a huge amount of data.

In addition, since it is necessary to process a huge amount of data to calculate the accumulated electric charge amount of the insulating film until breakdown of electric wire occurs, data acquisition is sometimes incomplete. Furthermore, since the electric charge amount is calculated based on raw waveform data obtained by an oscilloscope, etc., some data is missed depending on, e.g., performance of the oscilloscope. These result in a decrease in accuracy of lifetime assessment of electric wire.

The invention is based on such knowledge of the inventors.

An embodiment of the invention will be described below in reference to the drawings.

(1) Configuration of Partial Discharge Charge Amount Measuring Device

Figure 1:
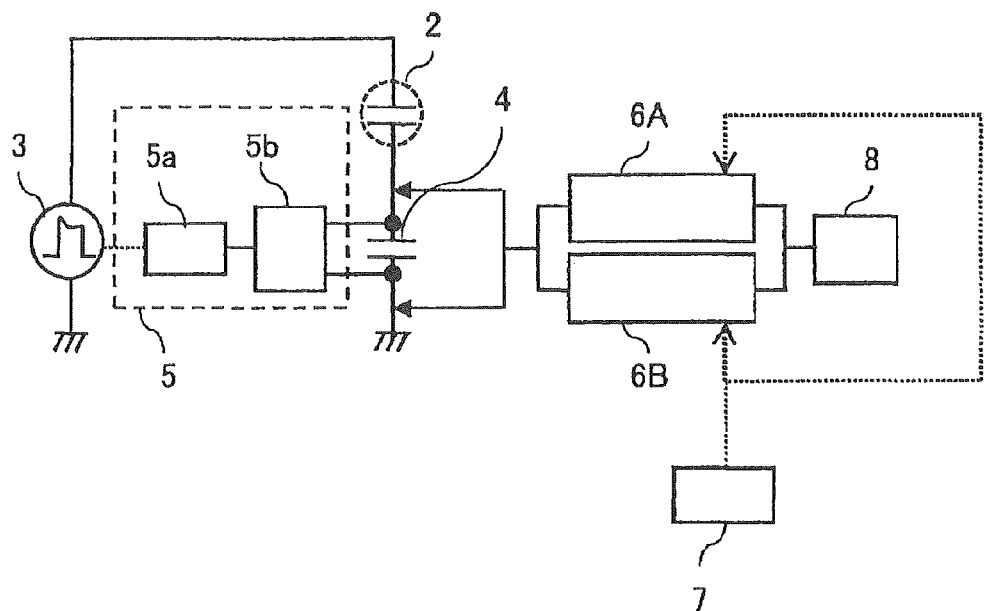
FIG. 1 is a schematic configuration diagram illustrating a partial discharge charge amount measuring device in an embodiment of the present invention.

Firstly, a configuration of a partial discharge charge amount measuring device in the embodiment of the invention will be described mainly using FIG. 1. FIG. 1 is a schematic configuration diagram illustrating a partial discharge charge amount measuring device 1 in the present embodiment.

As shown in FIG. 1, the partial discharge charge amount measuring device 1 in the present embodiment is provided with a voltage impressing device 3 which is connected to a sample 2 and applies voltage to the sample 2. The sample 2 is, e.g., an electric wire, such as enameled wire, provided with a conductor and an insulating film which is an insulation formed of a resin material and covering a periphery of the conductor. When voltage is applied to such a sample 2, an electric field concentrates in microvoids within the insulating film of the sample 2 or in microvoids between the conductor and the insulating film and very weak discharge (partial discharge) occurs. In other words, partial discharge occurs in the sample 2.

The voltage impressing device 3 is configured to apply voltage which causes partial discharge to occur in the sample 2. The voltage impressing device 3 is configured so that, e.g., voltage higher than partial discharge inception voltage of the sample 2 is applied to the sample 2. In other words, the voltage impressing device 3 is configured so that voltage higher than inverter surge voltage is applied to the sample 2. As the voltage impressing device 3, it is possible to use, e.g., voltage applying devices such as inverter pulse generator or surge pulse generator.

A capacitor 4 is connected in series to the sample 2 between the sample 2 and a ground. The capacitor 4 is configured to store electric charge generated by occurrence of partial discharge in the sample 2. The capacitor 4 having sufficiently large capacitance is used. In other words, the capacitor 4 having larger capacitance than that of the sample 2 is used. This allows most of voltage from the voltage impressing device 3 to be applied to the sample 2.

A short circuit (refresh circuitry) 5 is connected to both ends of the capacitor 4 to cause electric discharge by short-circuiting the both ends of the capacitor 4 when excess electric charge is accumulated in the capacitor 4. In other words, the short circuit 5 is a circuit periodically and forcibly causing short-circuit between the both ends of the capacitor 4 for a short period of time (e.g., a millisecond (ms)). Accordingly, it is possible to suppress variation in voltage which is caused by accumulation of electric charge in the capacitor 4 and is detected by data loggers 6A and 6B described later. Therefore, it is possible to accurately measure terminal voltage of the capacitor 4.

The short circuit 5 is composed of e.g., a trigger generator 5a for generating trigger signals and a relay circuit (switch circuit) 5b for controlling connection and disconnection to the capacitor 4. The short circuit 5 is configured to cause short-circuit between the both ends of the capacitor 4 by operating a relay when the relay circuit 5b receives a trigger signal from the trigger generator 5a. In addition, the short circuit 5 is connected to the voltage impressing device 3 and is configured to be capable of synchronizing with the voltage impressing device 3. The short circuit 5 is configured such that, once the voltage impressing device 3 begins to apply voltage to the sample 2, the trigger generator 5a receives a signal indicating the beginning of voltage application and subsequently outputs a trigger signal (e.g., drive pulse with a width of one millisecond (ms)) per predetermined period since the beginning of voltage application from the voltage impressing device 3 to the sample 2.

Figure 2:
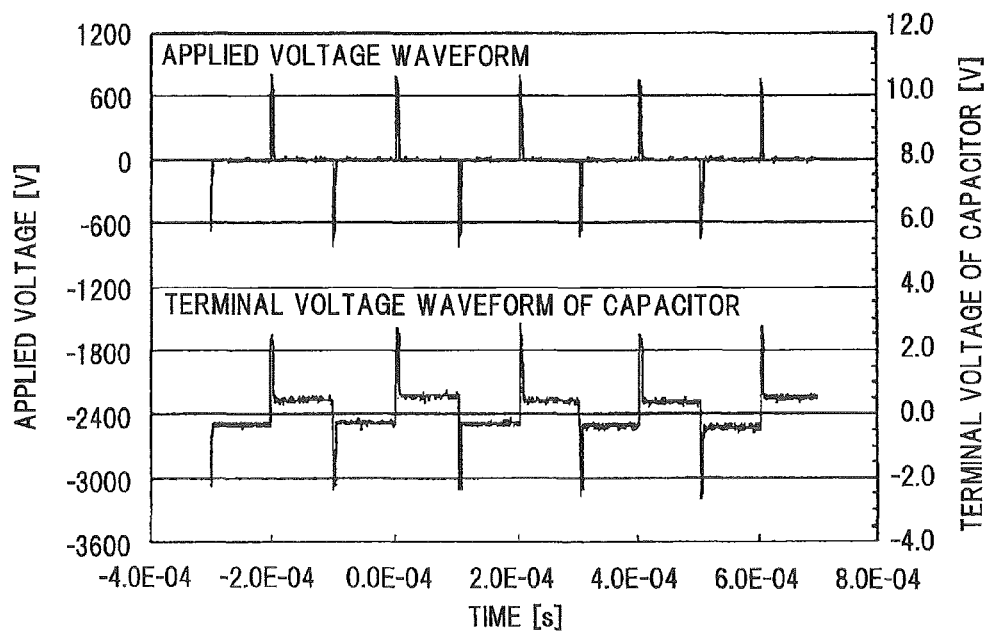
FIG. 2 is a diagram illustrating an example of voltage data recorded by data loggers provided in the partial discharge charge amount measuring device in the embodiment of the invention.

At least two data loggers 6A and 6B (e.g., two data loggers in the present embodiment) are connected to the both ends of the capacitor 4. Each of the data loggers 6A and 6B is configured to measure terminal voltage of the capacitor 4 and to record the measured voltage as, e.g., waveform data, etc. The data loggers 6A and 6B can record the terminal voltage of the capacitor 4 in the form of e.g., waveform data shown in FIGS. 2 and 3. Note that, it is possible to continuously record the terminal voltage of the capacitor 4 by one data logger. However, when the amount of electric charge discharged from the sample 2 and remaining in the capacitor 4 is calculated by a controller 8 based on the voltage data recorded by the data logger 6A or 6B as described later, the controller 8 may take long time to calculate the discharge amount. In addition, it may become difficult to know, e.g., variation of the sample 2 with time.

As shown in FIG. 1, the controller 8 which is described later is electrically connected to the data loggers 6A and 6B. The data loggers 6A and 6B are configure to transfer the recorded voltage data to the controller 8. The data loggers 6A and 6B are configured to create, e.g., one file containing voltage data recorded from the beginning to the end of operation of the data logger 6A or 6B (in one operation) and to transfer to the controller 8 per file.

A timer mechanism 7 for switching operation between the data loggers 6A and 6B is connected to the data loggers 6A and 6B. The timer mechanism 7 is configured to carry out, e.g., a predetermined time (e.g., 10 seconds) of monitoring after, e.g., the data logger 6A or 6B began its operation. It is configured such that, after a predetermined time (e.g., 10 seconds) elapsed since the beginning of operation of, e.g., the data logger 6A, the timer mechanism 7 outputs an operation stop signal to the data logger 6A and an operation start signal to the data logger 6B. As the timer mechanism 7, it is possible to use, e.g., a timer device or a timer circuit.

In other words, the data loggers 6A and 6B are configured to be alternately operated at every predetermined time (e.g., every 10 seconds) by the timer mechanism 7 at least until breakdown of the sample 2 occurs. For example, the data loggers 6A and 6B are preferably operated by the timer mechanism 7 such that the data logger 6A begins its operation and thereafter the data logger 6B terminates its operation. As a result, the failure in retrieval of terminal voltage data of the capacitor 4 due to the switching between the data loggers 6A and 6B can be prevented.

One time cycle from the beginning to the end of operation of the data logger 6A or 6B (time monitored by the timer mechanism 7) is determined by taking into consideration, e.g., size of voltage data which is recorded during one operation of the data logger 6A or 6B and is transferred to the controller 8. If one operating time of the data loggers 6A and 6B is too short, the amount of data transferred to and processed by the controller 8 may increase. This may result in that more time is required to process the data and it is also necessary to provide a storage area to store the huge amount of data. On the other hand, if one operating time of the data loggers 6A and 6B is too long, the amount of data stored in one file may become too large. Therefore, when the controller 8 calculates the amount of electric charge discharged from the sample 2 and remaining in the capacitor 4 based on the voltage data as described later, the controller 8 may take long time to calculate the discharge amount. As a result, when recording of voltage and calculation of the discharge amount are simultaneously carried out, the controller 8 may not be able to complete calculation of the discharge amount of the previous voltage data (file) before the next voltage data (file) is transferred from the data logger 6A or 6B.

Control Unit

Figure 4:
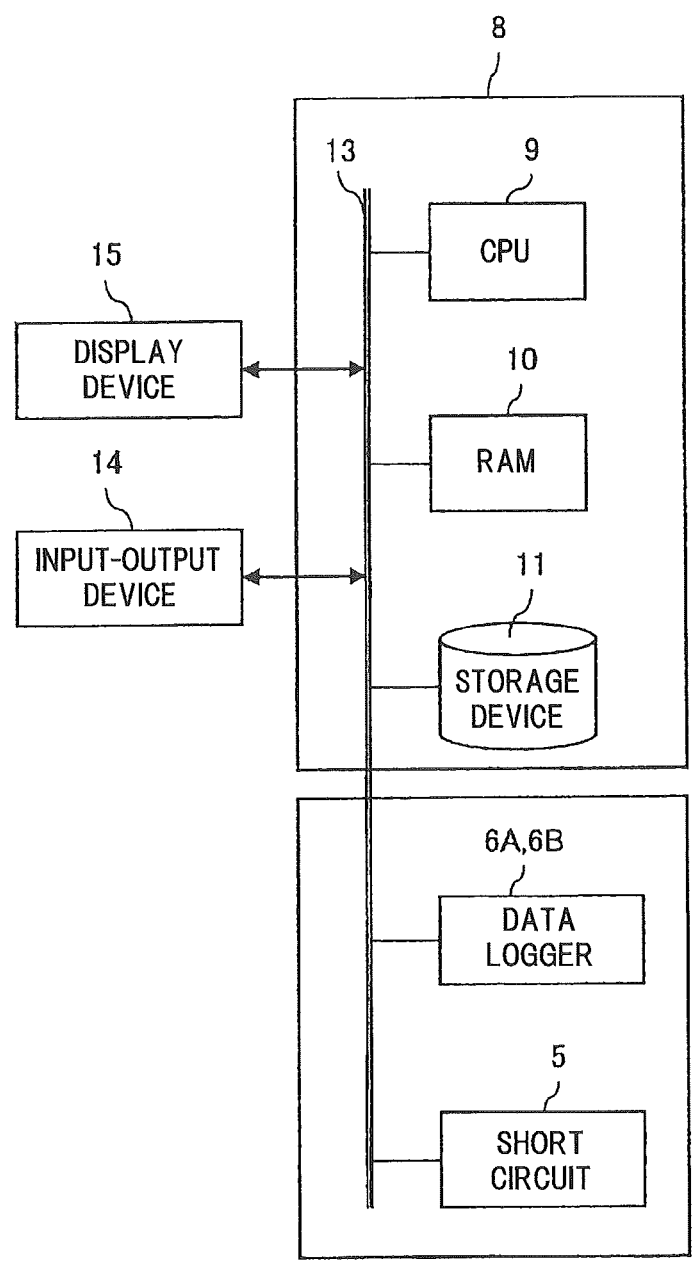
FIG. 4 is a schematic configuration diagram illustrating a control unit of the partial discharge charge amount measuring device preferably used in the invention.

As shown in FIG. 4, the controller 8 which is a control unit is configured as a computer provided with a central processing unit (CPU) 9, a memory (RAM) 10 having a storage area therein and a storage device 11 such as flash memory or HDD. The RAM 10 and the storage device 11 are configured to be able to exchange data with the CPU 9 through a cable 13. Operation terminals such as touch panel, mouse or keyboard may be connected as an input-output device 14 to the controller 8. In addition, a display, etc., may be connected as a display device 15 to the controller 8. Note that, the storage device 11 is configured as a computer-readable memory medium.

In the storage device 11, a program of procedure to calculate the discharge amount and a program of procedure to calculate an accumulated value of the discharge amount, etc., are readably stored. It is configured such that the CPU 9 retrieves and executes the programs stored in the storage device 11 to realize, e.g., calculation of the discharge amount, calculation of the accumulated value of the discharge amount and display of the discharge amount or the accumulated value of the discharge amount on the display device 15. The CPU 9 executes, e.g., excel VBA (Visual Basics for Applications), thereby realizing the calculation of the discharge amount.

The RAM 10 is configured as a memory area (work area) in which the program and data, etc., retrieved by the CPU 9 are temporarily stored. Programs are retrieved into the RAM 10 and are executed by the CPU 9 and the controller 8 as a computer thus achieves the below-described calculation of the discharge amount and the calculation of the accumulated value of the discharge amount.

(2) Partial Discharge Charge Amount Measuring Method

Figure 5:
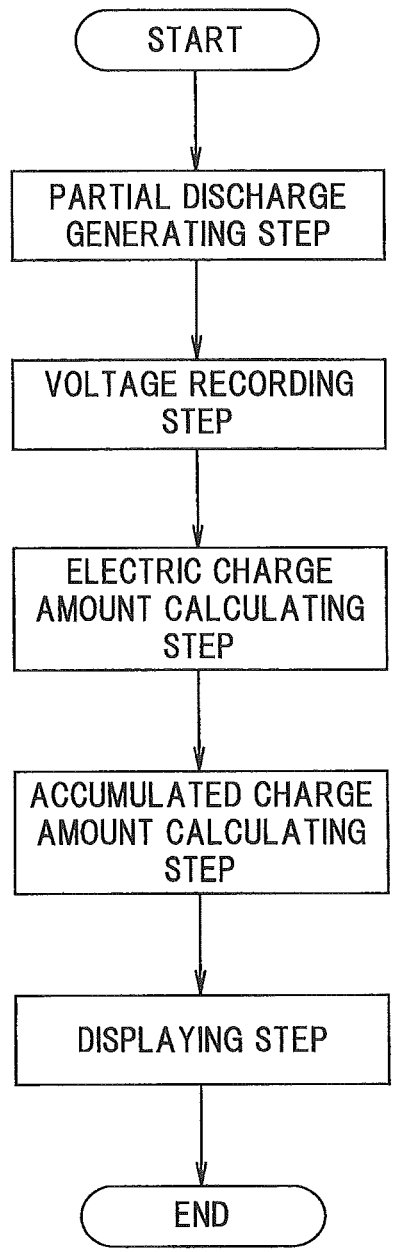
FIG. 5 is a flow chart showing a partial discharge charge amount measuring process in the embodiment of the invention.
Figure 6:
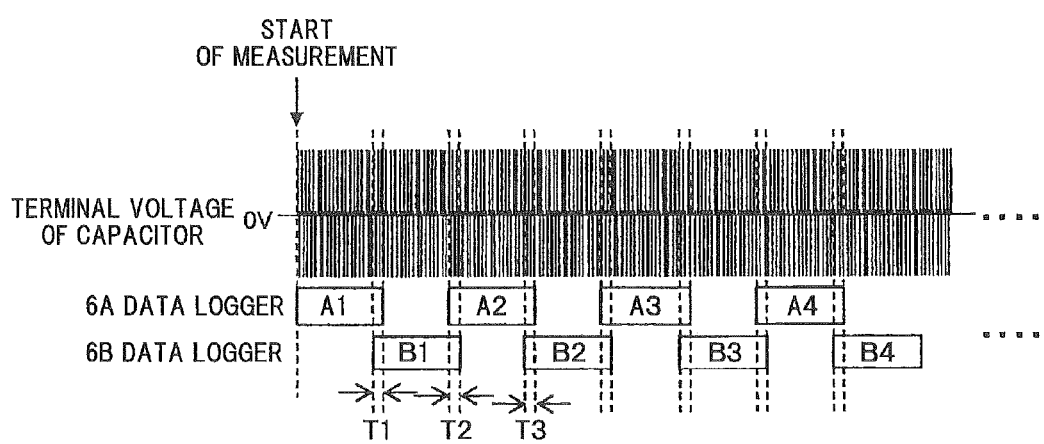
FIG. 6 is a schematic diagram illustrating an example of operating conditions of the data loggers in the embodiment of the invention.

Next, a partial discharge charge amount measuring method in the embodiment of the invention will be described mainly using FIGS. 5 and 6. FIG. 5 is a flow chart showing a method of measuring the discharge amount in the present embodiment. FIG. 6 is a schematic diagram illustrating an example of operating conditions of the data logger 6A and 6B in the present embodiment. It should be noted that, in the following description, operation of each component constituting the partial discharge charge amount measuring device 1 is controlled by the controller 8.

Partial Discharge Generating Step

Firstly, voltage is applied from the voltage impressing device 3 to the sample 2 to generate partial discharge in the sample 2. At this time, voltage higher than partial discharge inception voltage of the sample 2 is applied from the voltage impressing device 3 to the sample 2.

Voltage Recording Step

The voltage impressing device 3 begins to apply voltage to the sample 2 and, at the same time, the data logger 6A or 6B begins its operation and thus starts measurement and recording of the terminal voltage of the capacitor 4. Then, by alternately operating the data loggers 6A and 6B at every predetermined time, voltage output from the sample 2 is continuously measured and voltage data is recorded at least until breakdown of the sample 2 occurs. In other words, the terminal voltage of the capacitor 4 is continuously measured and recorded at least until breakdown of the sample 2 occurs.

In detail, the data logger 6A is operated first and begins to record voltage. After a predetermined time elapsed since the beginning of operation of the data logger 6A, the data logger 6B is operated and begins to record voltage. After the data logger 6B began its operation, operation of the data logger 6A is terminated. Then, after a predetermined time elapsed since the beginning of operation of the data logger 6B, the data logger 6A is operated again. After the data logger 6A begins recording, the data logger 6B stops recording. As such, the data loggers 6A and 6B are alternately operated at every predetermined time and the terminal voltage of the capacitor 4 is continuously recorded at least until breakdown of the sample 2 occurs.

At a time of switching operation between the data loggers 6A and 6B, the data loggers 6A and 6B are both operated only for a predetermined time. In other words, after the data logger 6A (or 6B) began its operation, the data logger 6B (or 6A) terminates its operation. By operating the data loggers 6A and 6B in an overlapping manner for a predetermined time, it is possible to suppress dropping of the terminal voltage data of the capacitor 4.

The operation between the data loggers 6A and 6B is switched by the timer mechanism 7 which is connected to the data loggers 6A and 6B. That is, after the data logger 6A (or 6B) began its operation, the timer mechanism 7 carries out a predetermined time (e.g., 10 seconds) of monitoring and then outputs an operation stop signal to the data logger 6A (or 6B) and an operation start signal to the data logger 6B (or 6A) after elapsing a predetermined time. As a result, it is possible to alternately operate the data loggers 6A and 6B at every predetermined time.

The data loggers 6A and 6B transfer the recorded terminal voltage data of the capacitor 4 to the CPU 9 in the form of, e.g., waveform data. That is, between the end of the previous operation and the beginning of the next operation, the data logger 6A or 6B creates, e.g., one file containing voltage data recorded in one operation and transfers the file to the CPU 9. At this time, information to specify the data logger is added to the voltage data to be transferred to the CPU 9 so that which of the data loggers 6A and 6B recorded the data can be specified. In addition, timing information may be also added to the voltage data to be transferred to the CPU 9.

When excess electric charge is accumulated in the capacitor 4, the short circuit connected to the both ends of the capacitor 4 is activated to cause electric discharge by short-circuiting the both ends of the capacitor 4. Preferably, the short circuit 5 is activated at every predetermined time since, e.g., the beginning of voltage application from the voltage impressing device 3 to the sample 2. This allows voltage applied to the capacitor 4 to be measured more accurately.

Discharge Amount Calculating Step

When the CPU 9 receives voltage data from the data logger 6A or 6B, the CPU 9 sends the voltage data to the RAM 10 and also retrieves the program for calculating the discharge amount from the storage device 11 into the RAM 10. Then, based on the voltage data received in the RAM 10, the CPU 9 calculates the amount of electric charge discharged from the sample 2 and remaining in the capacitor 4. As a result, the amount of electric charge generated in a predetermined period due to partial discharge of the sample 2 is calculated.

Figure 3:
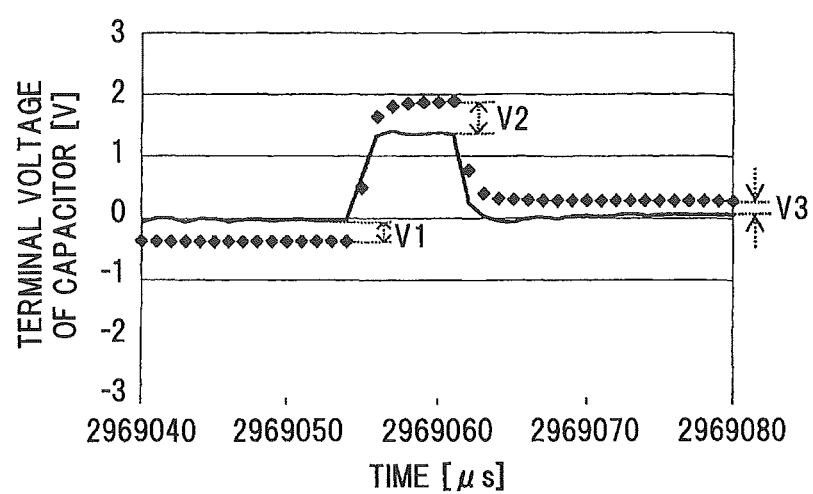
FIG. 3 is a diagram illustrating an example of voltage data recorded by the data loggers provided in the partial discharge charge amount measuring device in the embodiment of the invention.

In detail, at first, the CPU 9 calculates a difference in the terminal voltage of the capacitor 4 base on the received voltage data. Then, the amount of electric charge discharged from the sample 2 and remaining in the capacitor 4 is calculated by multiplying the difference in the terminal voltage of the capacitor 4 by capacitance of the capacitor 4. When, for example, voltage data shown in FIG. 3 is transferred to the CPU 9, the amount of electric charge discharged from the sample 2 and remaining in the capacitor 4 can be calculated by the following formula 1. It should be noted that, in FIG. 3, a solid line indicates the terminal voltage of the capacitor 4 without occurrence of partial discharge and a dotted line indicates that with occurrence of partial discharge.

$$Q = Cd \times (|V2-V1| + |V3-V2|) \quad \text{(Formula 1)}$$

Here, Q is the amount of electric charge discharged from the sample 2 and remaining in the capacitor 4, Cd is capacitance of the capacitor 4 and each of V1, V2 and V3 is a difference between a terminal voltage value of the capacitor 4 with occurrence of partial discharge and that without occurrence of partial discharge (a difference in the terminal voltage of the capacitor 4).

At this time, the CPU 9 calculates the discharge amount for each period from the beginning to the end of one operation of the data logger 6A (6B). That is, for example, the CPU 9 calculates the discharge amount per file transferred from the data logger 6A or 6B and readably stores the calculated discharge amount in the storage device 11.

Note that, there is a period where the data loggers 6A and 6B are operated in an overlapping manner, as described above. Therefore, when calculating the discharge amount, voltage during a period of operating the data loggers 6A and 6B in an overlapping manner (hereinafter, referred to also as "an overlap period") is subtracted from either the voltage measured by the data logger 6A or the voltage measured by the data logger 6B. For example, as shown in FIG. 6, voltage during a period T1 in which the data loggers 6A and 6B are operated in an overlapping manner is subtracted from voltage B1 measured by the data logger 6B. Then, voltage during an overlap period T2 is subtracted from voltage A2 measured by the data logger 6A. In other words, voltage during the overlap period is subtracted from voltage measured by the data logger 6A or 6B which next begins its operation.

The CPU 9 readably stores the calculated discharge amount per predetermined period (per file transferred from the data logger 6A or 6B).

Accumulated Discharge Amount Calculating Step

After the discharge amount calculating step is completed and the CPU 9 receives a command indicating the completion of the calculation of the discharge amount, the CPU 9 retrieves the discharge amount from the storage device 11 into the RAM 10 and also retrieves the program for calculating an accumulated discharge amount from the storage device 11 into the RAM 10. Then, the CPU 9 accumulates the discharge amount each time the discharge amount is calculated until breakdown of the sample 2 occurs, thereby calculating the accumulated discharge amount. In other words, the discharge amounts written on all files until the breakdown of the sample 2 are accumulated. As a result, it is possible to confirm the total electric charge amount (hereinafter, referred to also as "total discharge amount") until breakdown of the sample 2 occurs due to partial discharge, which allows lifetime of electric wire against partial discharge to be assessed.

Displaying Step

Figure 7:
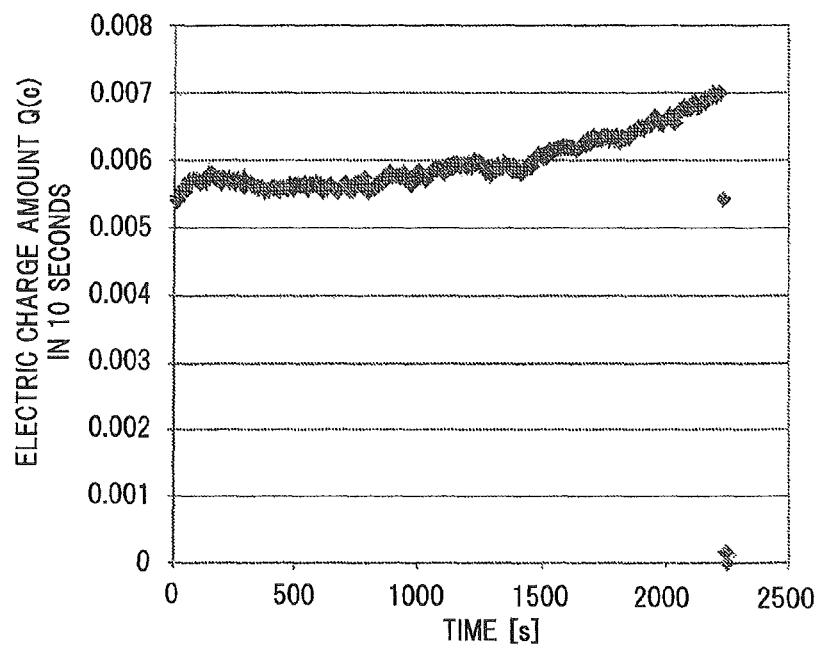
FIG. 7 is a diagram illustrating an example of a result of calculating the discharge amount of the sample displayed on a display device in the embodiment of the invention.

When the CPU 9 receives, from the input-output device 14, a command to display the discharge amount in the capacitor 4 (i.e., the amount of electric charge discharged from the sample 2) until breakdown of the sample 2 occurs, the calculation result of the amount of electric charge discharged from the sample 2 is retrieved from the storage device 11 by the CPU 9 and is displayed on the display device 15. At this time, for example as shown in FIG. 7, the calculation result of the amount of electric charge discharged from the sample 2 is time-sequentially displayed on the display device 15 in the form of a graph. Note that, a graph displayed on the display device 15 is not limited to a line graph as is shown in FIG. 7 and may be, e.g., a bar graph, etc.

Figure 8:
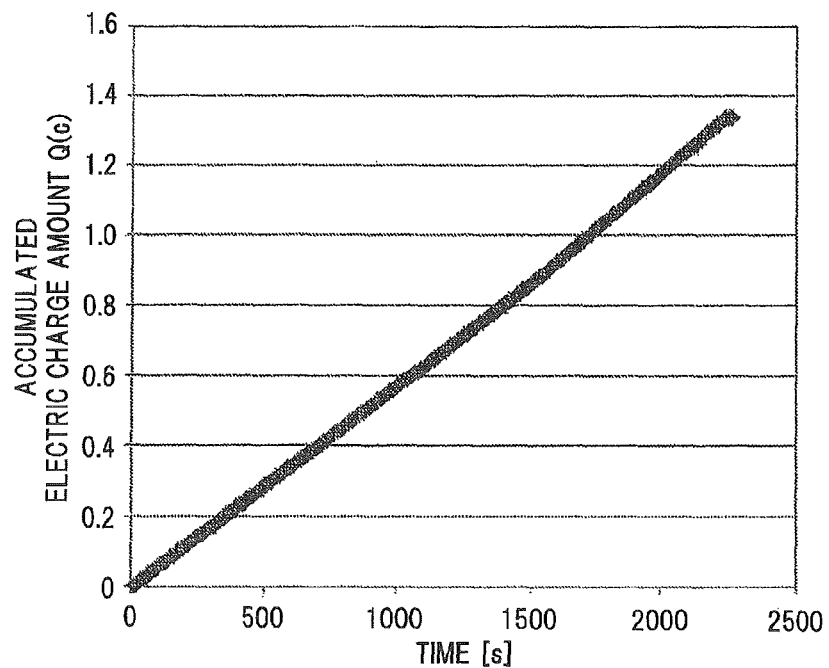
FIG. 8 is a diagram illustrating an example of a result of calculating the accumulated discharge amount of the sample displayed on the display device in the embodiment of the invention.

Meanwhile, when CPU 9 receives, from the input-output device 14, a command to display the accumulated discharge amount in the capacitor 4 (i.e., the amount of accumulated electric charge discharged from the sample 2) until breakdown of the sample 2 occurs, the calculation result of the accumulated electric charge amount of the sample 2 is retrieved from the storage device 11 by the CPU 9 and is displayed on the display device 15. At this time, for example as shown in FIG. 8, the calculation result of the amount of accumulated electric charge discharged from the sample 2 is time-sequentially displayed on the display device 15 in the form of a graph. Note that, a graph displayed on the display device 15 is not limited to a line graph as is shown in FIG. 8 and may be, e.g., a bar graph, etc., or alternatively, only a numerical value of the amount of accumulated electric charge discharged from the sample 2 may be displayed on the display device 15.

The voltage recording step, the discharge amount calculating step, the accumulated discharge amount calculating step and the displaying step are preferably simultaneously carried out. This allows, e.g., detection of the breakdown of the sample 2 at an earlier stage. In addition, in the event of, e.g., failure in the sample 2 or the partial discharge charge amount measuring device, the failure can be detected earlier.

Once the breakdown of the sample 2 is confirmed, the voltage impressing device 3 stops voltage application to the sample 2 and the data loggers 6A and 6B stop measurement, thereby terminating measurement of the discharge amount in the present embodiment.

(3) Effects of the Present Embodiment

In the present embodiment, following one or several effects are obtained.

(a) In the present embodiment, voltage is applied from the voltage impressing device 3 to generate partial discharge in the sample 2, two data loggers 6A and 6B connected to the both ends of the capacitor 4 are alternately operated at every predetermined time at least until breakdown of the sample 2 occurs, and the terminal voltage of the capacitor 4 is continuously measured and recorded. In addition, a difference in the terminal voltage of the capacitor 4 recorded by the data loggers 6A and 6B is multiplied by capacitance of the capacitor 4, thereby calculating the amount of electric charge discharged from the sample 2 and remaining in the capacitor 4. Then, values of the discharge amount at least until breakdown of the sample 2 occurs are accumulated to calculate the accumulated discharge amount. As a result, it is possible to know the total amount of electric charge (the total discharge amount) generated until breakdown of the sample 2 occurs, thereby obtaining an indicator of lifetime assessment of an electric wire which is the sample 2. In addition, the amount of electric charge generated due to partial discharge of the sample 2 can be accurately calculated with a small amount of data. As a result, the amount of electric charge generated due to partial discharge of the sample 2 can be calculated for a short period of time.

(b) In the present embodiment, the operation between the two data loggers 6A and 6B is switched by the timer mechanism 7 such that the data logger 6A begins its operation and the data logger 6B subsequently terminates its operation. As a result, it is possible to suppress dropping of the terminal voltage data of the capacitor 4. Therefore, it is possible to assess lifetime of the sample 2 more accurately.

(c) In the present embodiment, the data loggers 6A and 6B transfer voltage data to the controller 8 for every predetermined period which is from the beginning to the end of one operation. Then, the controller 8 calculates the discharge amount and the accumulated discharge amount in the capacitor 4 per voltage data recorded in a predetermined period and transferred from the data logger 6A or 6B. As a result, the total amount of electric charge discharged until breakdown of the sample 2 occurs can be accurately calculated with a smaller amount of data.

(d) In the present embodiment, when excess electric charge is accumulated in the capacitor 4 due to partial discharge of the sample 2, the short circuit 5 connected to the both ends of the capacitor 4 causes electric discharge by short-circuiting the both ends of the capacitor 4. As a result, it is possible to assess lifetime of the sample 2 more accurately.

(e) In the present embodiment, the discharge amount and the accumulated discharge amount until the breakdown of the sample 2 are time-sequentially displayed in a predetermined form on the display portion. As a result, it is possible to assess lifetime of the sample 2 more easily.

(f) In the present embodiment, the voltage recording step, the discharge amount calculating step, the accumulated discharge amount calculating step and the displaying step are simultaneously carried out. As a result, it is possible to quickly and easily detect the breakdown of the sample 2. In addition, in the event of e.g., failure in the sample 2 or the partial discharge charge amount measuring device 1, the failure can be detected quickly and easily.

Other Embodiments of the Invention

Although the embodiment of the invention has been specifically described, the invention is not intended to be limited to the embodiment and the various kinds of modifications can be implemented without departing from the gist of the invention.

Although two data loggers 6A and 6B are used in the embodiment, it is not limited thereto. That is, the partial discharge charge amount measuring device 1 may be provided with three or more data loggers.

Although the data logger 6A is initially operated in the embodiment, it is not limited thereto and the data logger 6B may be operated initially. In addition, when the partial discharge charge amount measuring device 1 is provided with three or more data loggers, any of them can be the initially-operated data logger as long as voltage applied to the capacitor 4 can be continuously measured and recorded by alternately operating three data loggers at every predetermined time.

Although the voltage recording step, the discharge amount calculating step, the accumulated discharge amount calculating step and the displaying step are simultaneously carried out in the embodiment, it is not limited thereto. That is, it may be configured such that each of the discharge amount calculating step, the accumulated discharge amount calculating step and the displaying step is started only when, e.g., the CPU 9 receives a start command for each step from the input-output device 14. In this case, the data loggers 6A and 6B are configured to measure and record voltage applied to the capacitor 4 and to subsequently transfer voltage data to the storage device 11 so that the voltage data is readably stored in the storage device 11. Then, when, for example, the CPU 9 receives a command from the input-output device 14 to start calculation of the discharge amount, the CPU 9 retrieves a predetermined program and the voltage data from the storage device 11 and calculates the discharge amount.

Although, in the embodiment, the discharge amount is calculated per operation of the data logger 6A or 6B in the discharge amount calculating step, it is not limited thereto. That is, the discharge amount may be calculated for, e.g., each pulse of voltage applied from the voltage impressing device 3 to the sample 2.

Although, in the embodiment, voltage during the overlap period is subtracted from voltage measured by the data logger 6A or 6B which next begins its operation in the discharge amount calculating step, it is not limited thereto. For example, it may be subtracted from voltage measured by the data logger 6A or 6B which terminated its operation. In other words, it may be such that the voltage during the overlap period T1 is subtracted from voltage A1 measured by the data logger 6A and voltage during the overlap period T2 is subtracted from the voltage B1 measured by the data logger 6B. Alternatively, voltage during the overlap period may be subtracted from, e.g., only voltage measured by the data logger 6A. In other words, it may be such that the voltage during the overlap period T1 is subtracted from the voltage A1 measured by the data logger 6A and voltage during the overlap periods T2 and T3 is subtracted from voltage A2 measured by the data logger 6A. Alternatively, voltage during the overlap period may be subtracted from, e.g., only voltage measured by the data logger 6B. In other words, voltage during the overlap periods T1 and T2 may be subtracted from the voltage B1 measured by the data logger 6B.

Although, in the embodiment, the electric charge amount and the accumulated electric charge amount of the sample 2 are respectively displayed in the form of a time-series line graph in the displaying step, it is not limited thereto.

Although the discharge amount and the accumulated discharge amount, etc., are calculated via the RAM 10 in the embodiment, it is not limited thereto. That is, the CPU 9 may directly retrieve a predetermined program from the storage device 11 without using the RAM 10 so that the discharge amount and the accumulated discharge amount, etc., are calculated in the CPU 9.

What is claimed is:

1. A partial discharge charge amount measuring method, comprising:
applying a voltage from a voltage impressing device connected to an electric wire comprising a conductor and an insulating film covering a periphery of the conductor, thereby generating a partial discharge in the insulating film, the voltage being higher than a partial discharge inception voltage of the insulating film;
continuously measuring and recording terminal voltages of a capacitor connected in series between the insulating film and a ground until a breakdown of the insulating film occurs by alternately operating at least two data loggers connected to the capacitor at intervals of a predetermined time;
calculating an amount of electric charge discharged from the insulating film and remaining in the capacitor by a formula (1):

$$Q = Cd \times (|V2-V1|+|V3-V2|) \qquad (1)$$

where Q is the amount of electric charge discharged from the insulating film and remaining in the capacitor, Cd is capacitance of the capacitor and each of V1, V2 and V3 is a difference between a terminal voltage value of the capacitor with occurrence of partial discharge and a terminal without occurrence of partial discharge; and
calculating an accumulated discharge amount by accumulating the discharged amount of electric charge from the partial discharge of the insulating film occurs until the breakdown of the insulating film occurs.

2. The method according to claim 1, wherein in the recording of terminal voltages, operation between the at least two data loggers is switched by a timer mechanism connected to the data loggers.

3. The method according to claim 1, wherein in the recording of terminal voltages, operation between the at least two data loggers is switched such that one of the data loggers starts operation and another of the data loggers subsequently terminates operation.

4. The method according to claim 1, wherein in the calculating of discharged amount of electric charge, the discharged amount is calculated per predetermined period that is from the beginning to the end of operation of one of the data loggers.

5. The method according to claim 1, wherein in the calculating of discharged amount of electric charge, discharge voltage in an overlap period of operating the at least two data logger in an overlapping manner is subtracted from voltage measured by either data logger to calculate the discharge amount during the predetermined period.

6. The method according to claim 1, wherein at least the recording of voltage and the calculating the discharge amount are simultaneously carried out.

7. The method according to claim 1, wherein in the recording of terminal voltages, a short circuit connected to both ends of the capacitor causes electric discharge by short-circuiting the both ends of the capacitor when excess electric charge is accumulated in the capacitor.

8. The method according to claim 1, further comprising, on a display portion, displaying at least the discharge amount until breakdown of the sample occurs.

* * * * *